(12) United States Patent
Yoshioka et al.

(10) Patent No.: US 9,184,258 B2
(45) Date of Patent: Nov. 10, 2015

(54) GAN BASED SEMICONDUCTOR DEVICE AND METHOD OF MANUFACTURING THE SAME

(71) Applicant: Kabushiki Kaisha Toshiba, Minato-ku Tokyo (JP)

(72) Inventors: Akira Yoshioka, Ishikawa (JP); Toru Sugiyama, Ishikawa (JP); Yasunobu Saito, Ishikawa (JP); Kunio Tsuda, Ishikawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/215,346

(22) Filed: Mar. 17, 2014

(65) Prior Publication Data

US 2015/0069405 A1 Mar. 12, 2015

(30) Foreign Application Priority Data

Sep. 11, 2013 (JP) ................................. 2013-188369

(51) Int. Cl.
*H01L 29/94* (2006.01)
*H01L 29/66* (2006.01)
*H01L 29/78* (2006.01)
*H01L 29/778* (2006.01)
*H01L 29/20* (2006.01)

(52) U.S. Cl.
CPC ...... *H01L 29/66462* (2013.01); *H01L 29/7787* (2013.01); *H01L 29/7788* (2013.01); *H01L 29/7813* (2013.01); *H01L 29/7827* (2013.01); *H01L 29/2003* (2013.01); *H01L 29/66674* (2013.01); *H01L 29/66712* (2013.01)

(58) Field of Classification Search
CPC .................. H01L 29/66674; H01L 29/66712; H01L 29/7813; H01L 29/7827
USPC ......................................... 257/328–330, 332
See application file for complete search history.

(56) References Cited

U.S. PATENT DOCUMENTS

| 2008/0128862 | A1 | 6/2008 | Sugimoto et al. |
| 2009/0278197 | A1 | 11/2009 | Ohta et al. |
| 2011/0186927 | A1* | 8/2011 | Kawaguchi et al. .......... 257/342 |

(Continued)

FOREIGN PATENT DOCUMENTS

| JP | 2006-140368 A | 6/2006 |
| JP | 2008-053448 A | 3/2008 |

(Continued)

*Primary Examiner* — Matthew E Warren
(74) *Attorney, Agent, or Firm* — White & Case LLP

(57) ABSTRACT

A semiconductor device according to one embodiment includes an n-type first GaN-based semiconductor layer, a p-type second GaN-based semiconductor layer on the first GaN-based semiconductor layer. The second GaN-based semiconductor layer includes a low impurity concentration region and a high impurity concentration region. An n-type third GaN-based semiconductor layer is provided on the second GaN-based semiconductor layer. The device includes a gate electrode being located adjacent to the third GaN-based semiconductor layer, the low impurity concentration region, and the first GaN-based semiconductor layer intervening a gate insulating film. The device includes a first electrode on the third GaN-based semiconductor layer, a second electrode on the high impurity concentration region, and a third electrode on the opposite side of the first GaN-based semiconductor layer from the second GaN-based semiconductor layer.

11 Claims, 10 Drawing Sheets

(56) References Cited

U.S. PATENT DOCUMENTS

2013/0307060 A1* 11/2013 Wang et al. .................. 257/330
2013/0313576 A1* 11/2013 Nakano ......................... 257/77
2014/0048847 A1* 2/2014 Yamashita et al. ............ 257/140
2014/0145209 A1* 5/2014 Kumagai ....................... 257/77
2014/0209999 A1* 7/2014 Sato et al. .................... 257/330

FOREIGN PATENT DOCUMENTS

| JP | 2008-053450 A | 3/2008 |
| JP | 2008-227356 A | 9/2008 |
| JP | 2009-152462 A | 7/2009 |
| JP | 2009-177110 A | 8/2009 |
| WO | 2011007483 A1 | 1/2011 |

* cited by examiner

GAN BASED SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2013-188369, filed on Sep. 11, 2013, the entire contents of which are incorporated herein by reference.

FIELD

Embodiments described herein relate generally to semiconductor devices and methods of manufacturing the semiconductor devices.

BACKGROUND

GaN-based semiconductors with high breakdown strength are expected to be applied to semiconductor devices for power electronics or high-frequency power semiconductor devices. To realize higher withstand voltage or higher integration, vertical devices with trench structures have been proposed.

Meanwhile, it is difficult to increase activation rates in p-type GaN-based semiconductors. As a result, the contact resistance between a p-type GaN-based semiconductor and an electrode on the p-type GaN-based semiconductor becomes higher.

DETAILED DESCRIPTION

Figure 1:
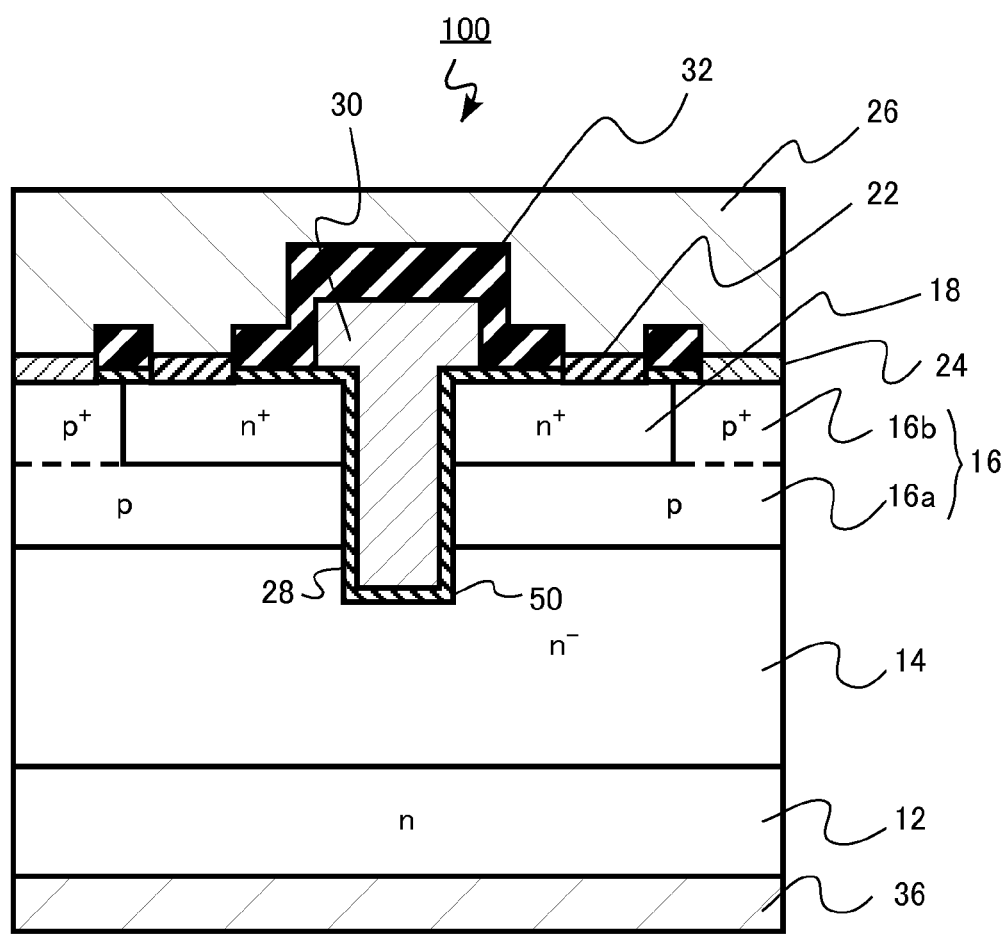
FIG. 1 is a schematic cross-sectional view of a semiconductor device according to a first embodiment.

A semiconductor device according to one embodiment includes: an n-type first GaN-based semiconductor layer; a p-type second GaN-based semiconductor layer that is provided above the first GaN-based semiconductor layer, and includes a low impurity concentration region on the side of the first GaN-based semiconductor layer and a high impurity concentration region on the opposite side from the first GaN-based semiconductor layer; an n-type third GaN-based semiconductor layer that is provided at the opposite side of the second GaN-based semiconductor layer from the first GaN-based semiconductor layer; a gate electrode that has one end located at the third GaN-based semiconductor layer or in a higher position than the third GaN-based semiconductor layer, has the other end located in the first GaN-based semiconductor layer, and is located adjacent to the third GaN-based semiconductor layer, the low impurity concentration region, and the first GaN-based semiconductor layer intervening a gate insulating film; a first electrode provided above the third GaN-based semiconductor layer; a second electrode provided above the high impurity concentration region; and a third electrode provided above the opposite side of the first GaN-based semiconductor layer from the second GaN-based semiconductor layer.

The following is a description of embodiments, with reference to the accompanying drawings. In the following description, like components are denoted by like reference numerals, and explanation of components once described will not be repeated.

In this specification, "GaN-based semiconductor" is a generic term for semiconductors containing GaN (gallium nitride), AlN (aluminum nitride), InN (indium nitride), and any intermediate composition of them. In this specification, AlGaN means a semiconductor expressed by the composition formula, $Al_xGa_{1-x}N$ (0<x<1).

In the following description, $n^+$, n, $n^-$, $p^+$, p, and $p^-$ indicate relative levels of impurity densities in the respective conductivity types. Specifically, the concentration of an $n^+$-type impurity is higher than the concentration of the corresponding n-type impurity, and the concentration of an $n^-$-type impurity is lower than the concentration of the corresponding n-type impurity. Likewise, the concentration of a $p^+$-type impurity is higher than the concentration of the corresponding p-type impurity, and the concentration of a $p^-$-type impurity is lower than the concentration of the corresponding p-type impurity. It should be noted that there are cases where the $n^+$-type and the $n^-$-type are referred to simply as the n-type, and the $p^+$-type and the $p^-$-type are referred to simply as the p-type.

First Embodiment

A semiconductor device according to this embodiment includes: an n-type first GaN-based semiconductor layer; a p-type second GaN-based semiconductor layer that is provided on or above the first GaN-based semiconductor layer, and includes a low impurity concentration region on the side of the first GaN-based semiconductor layer and a high impurity concentration region on the opposite side from the first GaN-based semiconductor layer; an n-type third GaN-based semiconductor layer that is provided on or at the opposite side of the second GaN-based semiconductor layer from the first GaN-based semiconductor layer; a gate electrode that has one end located in or at the third GaN-based semiconductor layer or in a higher position than the third GaN-based semiconductor layer, has the other end located in the first GaN-based semiconductor layer, and is located adjacent to the third GaN-based semiconductor layer, the low impurity concentration region, and the first GaN-based semiconductor layer intervening a gate insulating film; a first electrode provided on or above the third GaN-based semiconductor layer; a second electrode provided on or above the high impurity concentration region; and a third electrode provided on or at the opposite side of the first GaN-based semiconductor layer from the second GaN-based semiconductor layer.

FIG. 1 is a schematic cross-sectional view of the structure of a MOSFET that is a semiconductor device according to this embodiment. This MOSFET (Metal Oxide Semiconductor Field Effect Transistor) 100 is an n-channel transistor that uses electrons as carriers. The MOSFET 100 is also a vertical transistor that moves carriers between the source electrode on the upper surface side of the semiconductor substrate and the drain electrode on the lower surface side of the semiconductor substrate.

This MOSFET 100 includes an n-type GaN layer (a first GaN-based semiconductor layer) 14 on an n-type GaN substrate (a GaN-based semiconductor) 12.

The n-type GaN substrate 12 is a (0001) substrate, for example. Alternatively, the n-type GaN substrate 12 may be a substrate that is offset from (0001), or may be a substrate having an orientation other than a (0001) substrate.

The GaN substrate 12 functions as the drain region of the MOSFET 100. The GaN substrate 12 contains Si (silicon) as the n-type impurity, for example.

The n-type impurity concentration in the GaN substrate 12 is not lower than $1\times10^{18}$ cm$^{-3}$ and not higher than $1\times10^{20}$ cm$^{-3}$, for example. The thickness of the GaN substrate 12 is not smaller than 50 µm and not greater than 200 µm, for example.

The n-type GaN layer (the first GaN-based semiconductor layer) 14 is a so-called drift layer. The n-type GaN layer 14 contains Si (silicon) as the n-type impurity, for example. The n-type impurity concentration in the GaN layer 14 is not lower than $5\times10^{15}$ cm$^{-3}$ and not higher than $5\times10^{16}$ cm$^{-3}$, for example. The n-type impurity concentration in the n-type GaN layer 14 is lower than the n-type impurity concentration in the GaN substrate 12. The thickness of the n-type GaN layer 14 is not smaller than 4 µm and not greater than 25 µm, for example.

A p-type GaN layer (a second GaN-based semiconductor layer) 16 is formed on the n-type GaN layer 14. The p-type GaN layer 16 contains Mg (magnesium) as the p-type impurity, for example. The p-type GaN layer 16 is an epitaxially grown layer.

The p-type GaN layer 16 includes a low impurity concentration region 16a on the side of the n-type GaN layer 14, and a high impurity concentration region 16b on the opposite side from the n-type GaN layer 14. The low impurity concentration region 16a functions as the channel region of the MOSFET 100. The high impurity concentration region 16b functions as a channel contact region for forming an electrode connected to the channel region.

The p-type impurity concentration in the low impurity concentration region 16a is not lower than $5\times10^{15}$ cm$^{-3}$ and not higher than $5\times10^{16}$ cm$^{-3}$, for example. The p-type impurity concentration in the high impurity concentration region 16b is not lower than $1\times10^{18}$ cm$^{-3}$ and not higher than $1\times10^{22}$ cm$^{-3}$, for example.

The thickness of the low impurity concentration region 16a is not smaller than 0.5 µm and not greater than 2.0 µm, for example. The thickness of the high impurity concentration region 16b is not smaller than 50 nm and not greater than 300 nm, for example.

An n-type GaN layer (a third GaN-based semiconductor layer) 18 is formed on the opposite side of the p-type GaN layer (the second GaN-based semiconductor layer) 16 from the n-type GaN layer 14. The n-type GaN layer (the third GaN-based semiconductor layer) 18 functions as the source region of the MOSFET 100.

The n-type GaN layer 18 contains Si (silicon) as the n-type impurity, for example. The n-type impurity concentration in the n-type GaN layer (the third GaN-based semiconductor layer) 18 is higher than the n-type impurity concentration in the n-type GaN layer 14. The n-type impurity concentration in the n-type GaN layer 18 is not lower than $1\times10^{18}$ cm$^{-3}$ and not higher than $1\times10^{22}$ cm$^{-3}$, for example.

The MOSFET 100 has a trench 50 that has one end located in the n-type GaN layer (the third GaN-based semiconductor layer) 18, and has the other end located in the n-type GaN layer (the first GaN-based semiconductor layer) 14. The trench 50 extends from the upper surface of the n-type GaN layer 18, penetrates through the p-type GaN layer 16, and has its bottom portion located in the n-type GaN layer 14. The depth of the trench 50 is not smaller than 1.0 µm and not greater than 2.0 µm, for example.

A gate insulating film 28 is formed on the p-type GaN layer (the second GaN-based semiconductor layer) 16 serving as the inner wall of the trench 50. More specifically, the gate insulating film 28 is formed continuously on the n-type GaN layer 18, the low impurity concentration region 16a, and the n-type GaN layer 14. The gate insulating film 28 is a silicon oxide film, for example. The thickness of the gate insulating film 28 is not smaller than 50 nm and not greater than 200 nm.

A gate electrode 30 is formed on the gate insulating film 28. The gate electrode 30 fills the trench 50. The gate electrode 30 is formed with p-type polysilicon doped with B (boron) or n-type polysilicon doped with P (phosphorus), for example. Other than polysilicon, a metal silicide, a metal, or the like can be used as the gate electrode 30.

An interlayer insulating film 32 formed with a silicon oxide film, for example, is formed on the gate electrode 30.

The gate electrode 30 has one end located in the n-type GaN layer (the third GaN-based semiconductor layer) 18 or in a higher position than the n-type GaN layer (the third GaN-based semiconductor layer) 18, and has the other end located in the n-type GaN layer (the first GaN-based semiconductor layer) 14. The gate electrode 30 is located adjacent to the n-type GaN layer (the third GaN-based semiconductor layer) 18, the low impurity concentration region 16a, and the n-type GaN layer (the first GaN-based semiconductor layer) 14 intervening the gate insulating film 28.

A first electrode (a first source electrode) 22 is formed on the n-type GaN layer (the third GaN-based semiconductor layer) 18. The first electrode (the first source electrode) 22 has a stack structure of Ti (titanium)/Al (aluminum)/Ti (titanium), for example.

A second electrode (a second source electrode) 24 is formed on the high impurity concentration region 16b of the p-type GaN layer (the second GaN-based semiconductor layer) 16. The second electrode (the second source electrode) 24 has a stack structure of Ni (nickel)/Ag (silver)/Ti (titanium), for example.

Further, a pad electrode 26 that electrically connects the first electrode (the first source electrode) 22 and the second electrode (the second source electrode) 24 is formed. The pad electrode 26 has a stack structure of Ti (titanium)/Al (aluminum), for example.

A third electrode (a drain electrode) 36 is formed on the opposite side of the n-type GaN layer 14 from the p-type GaN layer (the second GaN-based semiconductor layer) 16 or on the opposite side of the n-type GaN substrate 12 from the n-type GaN layer 14. The third electrode (the drain electrode) 36 has a stack structure of Ti (titanium)/Al (aluminum)/Ti (titanium), for example.

Figure 2:
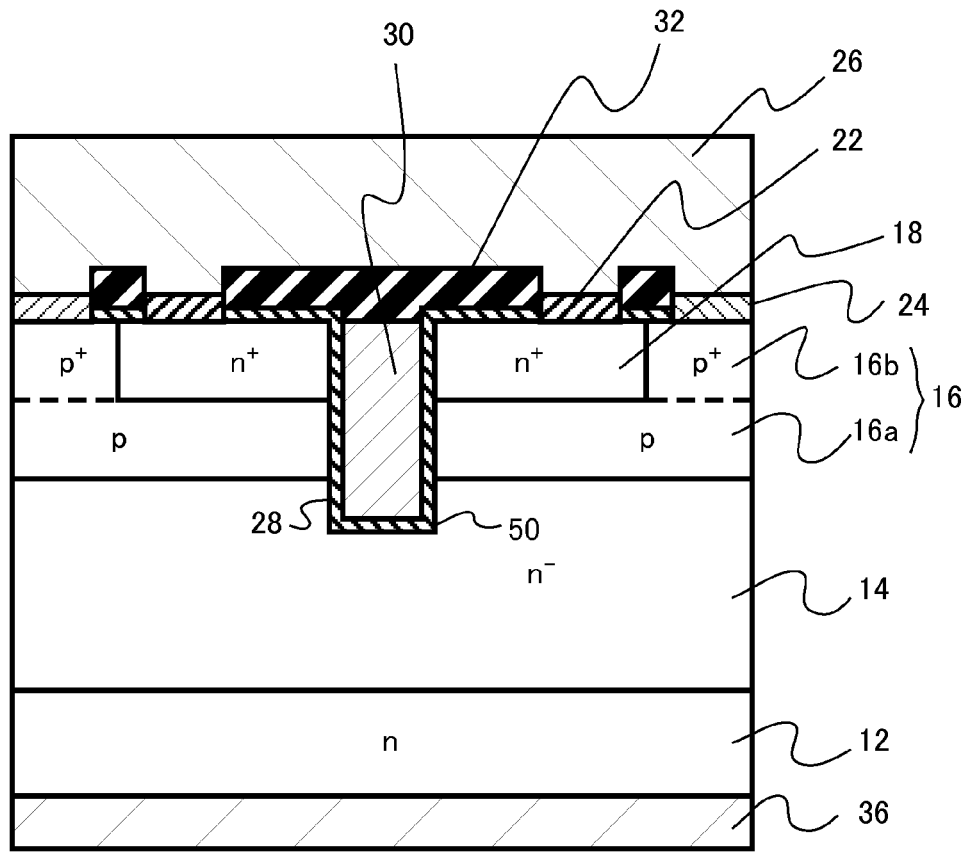
FIG. 2 is a schematic cross-sectional view of a semiconductor device according to a modification of the first embodiment.

FIG. 2 is a schematic cross-sectional view of the structure of a MOSFET that is a semiconductor device according to a modification of this embodiment. As shown in the drawing, one end of the gate electrode 30 is located in the same plane as the upper surface (upper end) of the n-type GaN layer (the third GaN-based semiconductor layer) 18.

Next, a method of manufacturing the semiconductor device according to this embodiment is described.

The method of manufacturing the semiconductor device according to this embodiment includes: forming the p-type second GaN-based semiconductor layer on the n-type first GaN-based semiconductor layer by an epitaxial growth technique, the p-type second GaN-based semiconductor layer being made to include the low impurity concentration region on the side of the first GaN-based semiconductor layer and the high impurity concentration region on the opposite side from the first GaN-based semiconductor layer by varying the p-type impurity concentration in the source gas from a low concentration to a high concentration; forming the n-type third GaN-based semiconductor layer on the opposite side of the second GaN-based semiconductor layer from the first GaN-based semiconductor layer; forming the first trench that has one end located in the third GaN-based semiconductor layer and has the other end located in the first GaN-based semiconductor layer; forming the gate insulating film on the inner wall of the trench, the inner wall being formed with the third GaN-based semiconductor layer, the low impurity concentration region, and the first GaN-based semiconductor layer; forming the gate electrode on the gate insulating film; forming the first electrode on the third GaN-based semiconductor layer; forming the second electrode on the high impurity concentration region; and forming the third electrode on the opposite side of the first GaN-based semiconductor layer from the second GaN-based semiconductor layer.

FIGS. 3 through 6 are schematic cross-sectional views illustrating the method of manufacturing the semiconductor device according to this embodiment.

First, the n-type GaN substrate 12 that contains Si (silicon) as the n-type impurity at $1\times10^{18}$ to $1\times10^{20}$ cm$^{-3}$ is prepared.

The high-resistance n-type GaN layer (the first GaN-based semiconductor layer) 14 that contains Si as the n-type impurity at $5\times10^{15}$ to $5\times10^{16}$ cm$^{-3}$, for example, and has a thickness of 5 to 20 μm, for example, is formed on the n-type GaN substrate 12 by an epitaxial growth technique. The epitaxial growth is conducted by MOCVD (Metal Organic Chemical Vapor Deposition), for example.

Figure 3:
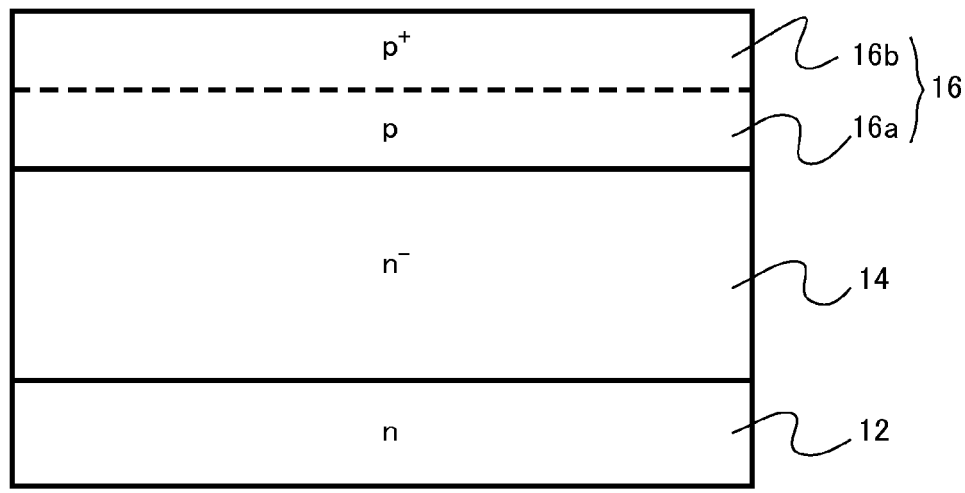
FIG. 3 is a schematic cross-sectional view illustrating a method of manufacturing the semiconductor device according to the first embodiment.

After that, the p-type GaN layer (the second GaN-based semiconductor layer) 16 is formed on the n-type GaN layer 14 by an epitaxial growth technique. When the p-type GaN layer (the second GaN-based semiconductor layer) 16 is formed, the p-type impurity concentration in the source gas is varied from a low concentration to a high concentration, so that the low impurity concentration region 16a is formed on the side of the n-type GaN layer 14, and the high impurity concentration region 16b is formed on the opposite side from the n-type GaN layer 14 (FIG. 3).

The p-type impurity is Mg (magnesium), for example. The source gas may be a trimethylgallium (TMG) gas or an ammonia (NH$_3$) gas, for example, and the p-type dopant in the source gas is cyclopentadienyl magnesium (Cp$_2$Mg), for example.

The p-type impurity concentration in the source gas is adjusted so that the p-type impurity concentration in the low impurity concentration region 16a becomes not lower than $5\times10^{15}$ cm$^{-3}$ and not higher than $5\times10^{16}$ cm$^{-3}$, for example. The p-type impurity concentration in the source gas is then changed so that the p-type impurity concentration in the high impurity concentration region 16b becomes not lower than $1\times10^{18}$ cm$^{-3}$ and not higher than $1\times10^{22}$ cm$^{-3}$, for example.

The thickness of the low impurity concentration region 16a is not smaller than 0.5 μm and not greater than 2.0 μm, for example. The thickness of the high impurity concentration region 16b is not smaller than 50 nm and not greater than 300 nm, for example.

After that, the n-type GaN layer (the third GaN-based semiconductor layer) 18 that is located on the opposite side of the p-type GaN layer (the second GaN-based semiconductor layer) 16 from the n-type GaN layer 14, and has a higher n-type impurity concentration than that of the n-type GaN layer (the first GaN-based semiconductor layer) 14 is formed.

Figure 4:
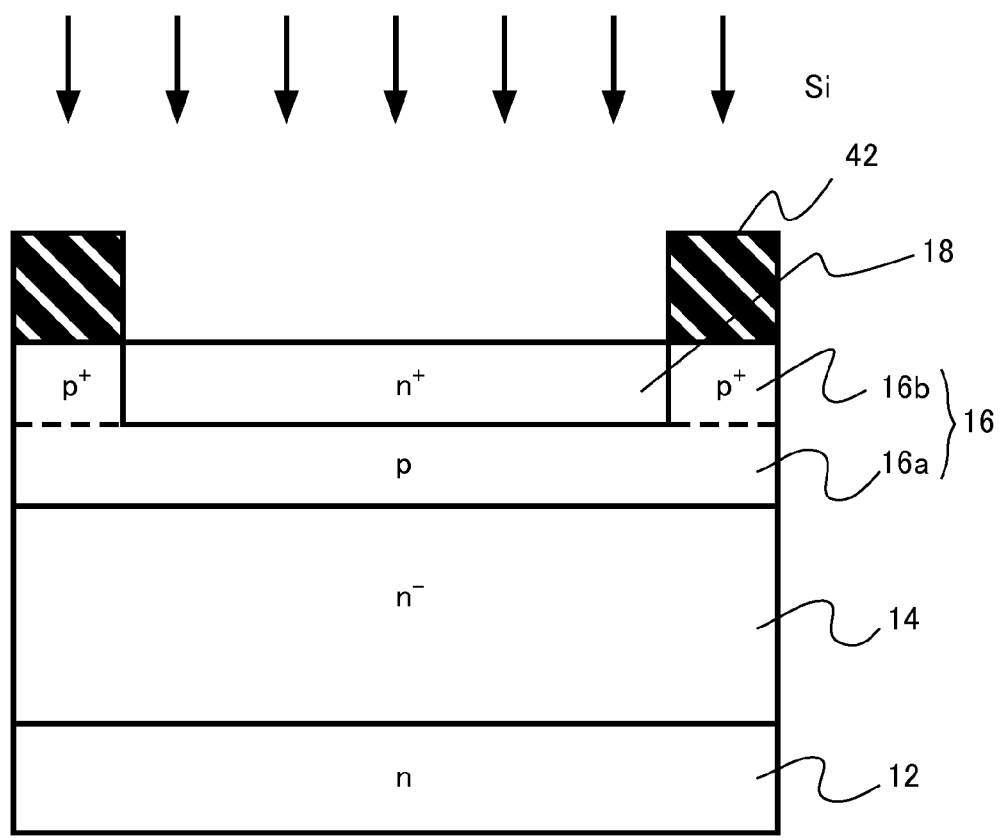
FIG. 4 is a schematic cross-sectional view illustrating the method of manufacturing the semiconductor device according to the first embodiment.

To form the n-type GaN layer 18, patterning is first performed on a silicon oxide film by photolithography and etching, and a first mask material 42 is formed with the silicon oxide film. With the first mask material 42 serving as an ion implantation mask, Si ions as the n-type impurity are implanted into the p-type GaN layer (the second GaN-based semiconductor layer) 16 (FIG. 4).

As a result, the n-type GaN layer (the third GaN-based semiconductor layer) 18 contains a p-type impurity at substantially the same concentration as the p-type impurity concentration in the p-type GaN layer (the second GaN-based semiconductor layer) 16, or more specifically, the high impurity concentration region 16b.

Annealing for activating the n-type impurity is then performed. In this annealing, an argon (Ar) gas is used as the atmosphere gas, and the heating temperature is 1000° C., for example.

Figure 5:
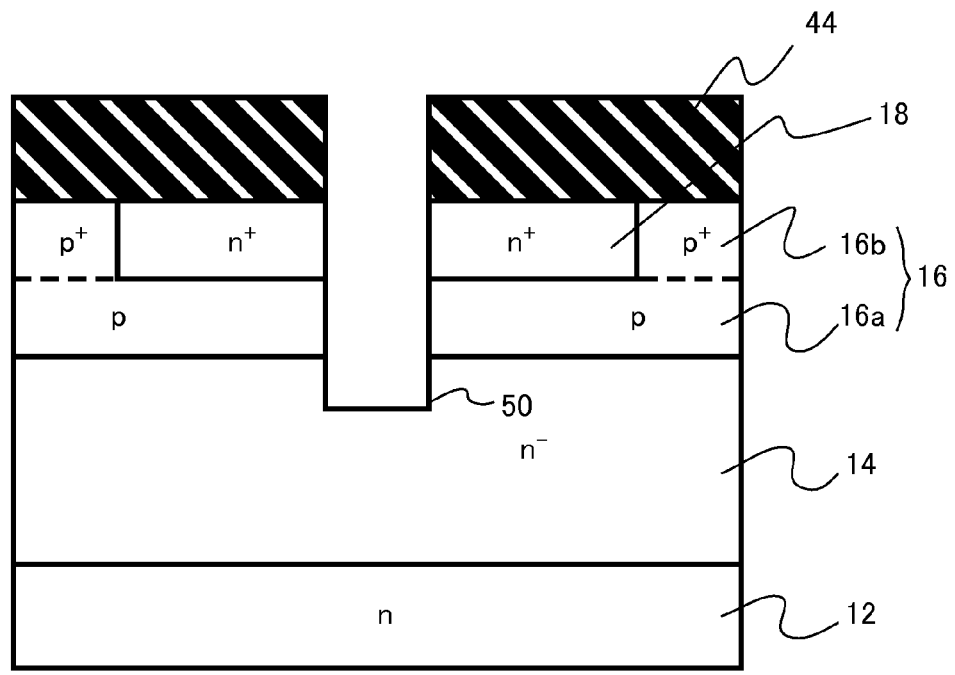
FIG. 5 is a schematic cross-sectional view illustrating the method of manufacturing the semiconductor device according to the first embodiment.

The first trench 50 that has one end located in the n-type GaN layer (the third GaN-based semiconductor layer) 18 and has the other hand located in the n-type GaN layer (the first GaN-based semiconductor layer) 14 is then formed (FIG. 5). To form the first trench 50, patterning is first performed on a silicon oxide film by photolithography and etching, and a second mask material 44 is formed with the silicon oxide film, for example. With the second mask material 44 serving as a mask, the first trench 50 that extends from the upper surface of the n-type GaN layer 18, penetrates through the p-type GaN layer 16, and has its bottom portion located in the n-type GaN layer 14 is formed by RIE (Reactive Ion Etching), for example. The depth of the trench 50 is not smaller than 1.0 μm and not greater than 2.0 μm, for example.

The gate insulating film 28 is then formed on the n-type GaN layer (the third GaN-based semiconductor layer) 18, the low impurity concentration region 16a, and the n-type GaN layer (the first GaN-based semiconductor layer) 14, which constitute the inner wall of the first trench 50. To form the gate insulating film 28, a silicon oxide film is deposited by LPCVD (Low Pressure Chemical Vapor Deposition), for example. The thickness of the gate insulating film 28 is not smaller than 50 nm and not greater than 200 nm, for example.

Figure 6:
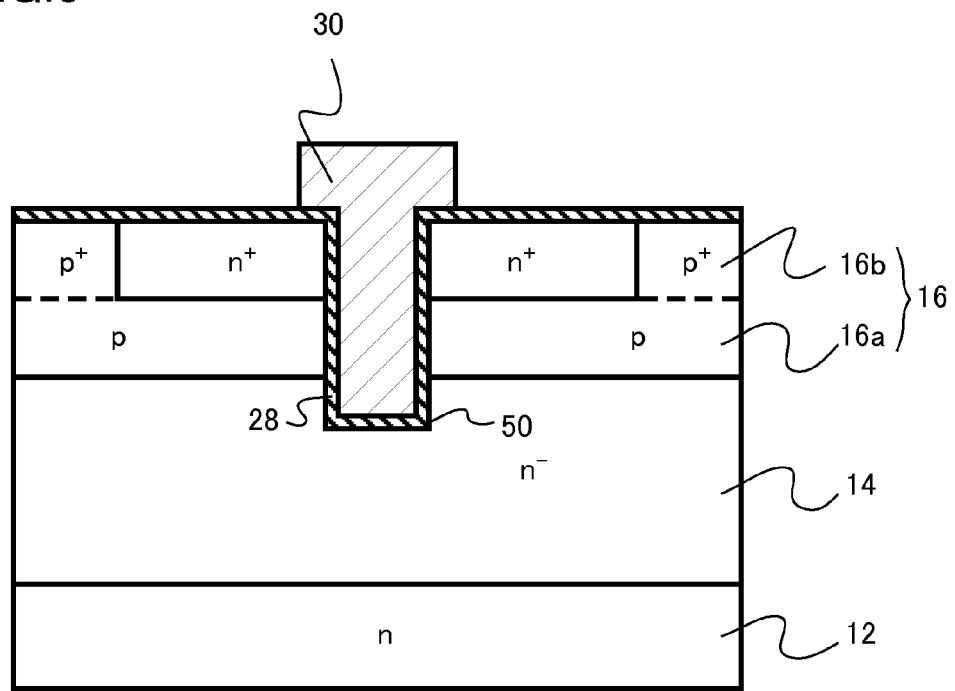
FIG. 6 is a schematic cross-sectional view illustrating the method of manufacturing the semiconductor device according to the first embodiment.

The gate electrode 30 is then formed on the gate insulating film 28 (FIG. 6). To form the gate electrode 30, p-type polysilicon doped with B (boron) is deposited by LPCVD (Low Pressure Chemical Vapor Deposition), for example. After that, patterning is performed on the p-type polysilicon by photolithography and etching.

The first electrode (the first source electrode) 22 is then formed on the n-type GaN layer (the third GaN-based semiconductor layer) 18. To form the first electrode (the first source electrode) 22, part of the gate insulating film 28 is removed by photolithography and etching. Ti (titanium)/Al (aluminum)/Ti (titanium) are then stacked by a sputtering technique, for example. After that, patterning is performed on the Ti (titanium)/Al (aluminum)/Ti (titanium) by photolithography and etching. Annealing at 700° C., for example, is then performed by RTA (Rapid Thermal Anneal).

The second electrode (the second source electrode) 24 is then formed on the high impurity concentration region 16b of the p-type GaN layer (the second GaN-based semiconductor layer) 16. To form the second electrode (the second source electrode) 24, part of the gate insulating film 28 is removed by photolithography and etching. Prior to resist removal, Ni (nickel)/Ag (silver)/Ti (titanium) are deposited by vacuum deposition, for example. The Ni (nickel)/Ag (silver)/Ti (titanium) are then partially removed by such a liftoff technique that the Ni (nickel)/Ag (silver)/Ti (titanium) remains on the high impurity concentration region 16b. Annealing at 600° C., for example, is then performed by RTA (Rapid Thermal Anneal).

After that, the interlayer insulating film 32 is formed on the gate electrode 30. To form the interlayer insulating film 32, a silicon oxide film is deposited by PECVD (Plasma Enhanced Chemical Vapor Deposition), for example.

The pad electrode 26 that electrically connects the first electrode (the first source electrode) 22 and the second electrode (the second source electrode) 24 is then formed. To form the pad electrode 26, openings are formed in the portions of the interlayer insulating film 32 located on the first electrode 22 and the second electrode 24, for example, by photolithography and etching. After that, Ti (titanium)/Al (aluminum), for example, are deposited by a sputtering technique. Annealing at 700° C., for example, is then performed by RTA (Rapid Thermal Anneal).

The third electrode (the drain electrode) 36 is then formed on the opposite side of the n-type GaN layer (the first GaN-based semiconductor layer) 14 from the p-type GaN layer (the second GaN-based semiconductor layer) 16. In other words, the third electrode (the drain electrode) 36 is formed under the lower surface of the n-type GaN substrate 12.

For example, Ti (titanium)/Al (aluminum)/Ti (titanium) are deposited on the lower surface of the n-type GaN substrate 12 by vacuum deposition. After that, a heat treatment is performed by a laser anneal technique.

Prior to the formation of the third electrode (the drain electrode) 36, the lower surface of the n-type GaN substrate 12 may be made thinner by CMP (Chemical Mechanical Polishing), for example. For example, the thickness of the n-type GaN substrate 12 is reduced to a thickness that is not smaller than 50 µm and not greater than 200 µm.

By the above described manufacturing method, the MOSFET 100 shown in FIG. 1 is formed.

In this embodiment, the p-type GaN layer (the second GaN-based semiconductor layer) 16 including the high impurity concentration region 16b is formed by an epitaxial growth technique. As a result, the activation rate of the p-type impurity in the high impurity concentration region 16b becomes higher. Accordingly, the contact resistance between the second electrode (the second source electrode) 24 and the high impurity concentration region 16b becomes lower. Also, the resistance of the high impurity concentration region 16b becomes lower. Accordingly, the potential of the low impurity concentration region 16a functioning as the channel region of the MOSFET 100 can be stabilized. Thus, the MOSFET 100 that performs stable operations can be realized.

In a case where a p-type impurity layer is formed by introducing a p-type impurity into a GaN-based semiconductor by an ion implantation technique, for example, it is difficult to achieve a high activation rate even if a heat treatment for activation is performed. This is supposedly because the diffusion of the p-type impurity caused by the heat treatment in the GaN-based semiconductor is slow, and the p-type impurity does not easily enter crystal lattice sites. In this case, the contact resistance between the p-type impurity layer and an electrode such as a metal electrode formed on the p-type impurity layer cannot be lowered.

In a case where a p-type impurity layer is formed by an epitaxial growth technique, on the other hand, the growth starts from a vapor phase, and accordingly, the p-type impurity can easily enter crystal lattice sites. As a result, the activation rate of the p-type impurity in the p-type impurity layer can be increased. Accordingly, the contact resistance between the p-type impurity layer and an electrode such as a metal electrode formed on the p-type impurity layer can be lowered.

Furthermore, crystal defects due to ion implantation can be avoided in this embodiment, as the p-type GaN layer (the second GaN-based semiconductor layer) 16 is formed by an epitaxial growth technique, instead of an ion implantation technique. Accordingly, the MOSFET 100 that has excellent characteristics such as reduced junction leakage current can be realized.

In this embodiment, the first electrode 22 and the second electrode 24 are formed with different materials from each other. As the materials with work functions optimized for an n-type impurity layer and a p-type impurity layer are selected, the contact resistance between the second electrode (the second source electrode) 24 and the high impurity concentration region 16b can be made even lower.

Second Embodiment

A semiconductor device according to this embodiment and a method of manufacturing the semiconductor device are the same as those according to the first embodiment, except that the first electrode and the second electrode are provided with the same materials. Therefore, explanation of the same aspects as those of the first embodiment is not repeated herein.

Figure 7:
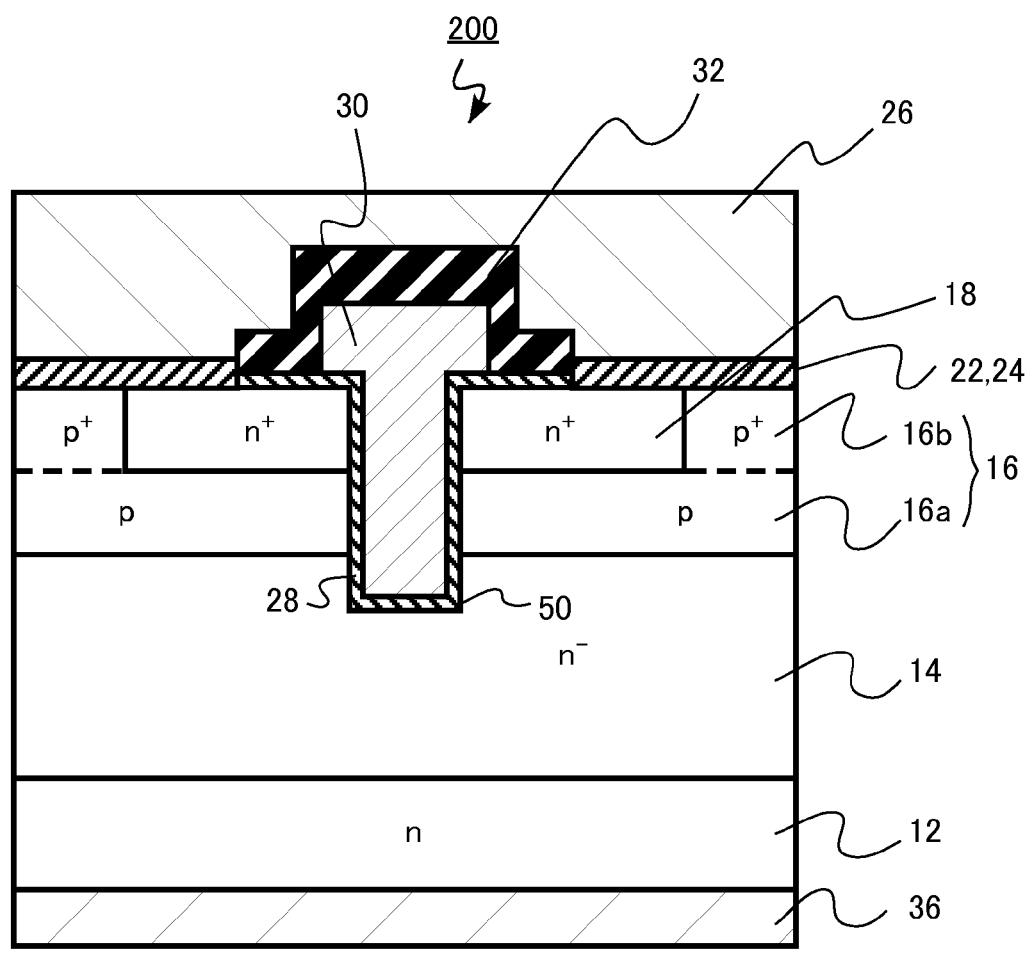
FIG. 7 is a schematic cross-sectional view of a semiconductor device according to a second embodiment.

FIG. 7 is a schematic cross-sectional view of the structure of a MOSFET that is a semiconductor device according to this embodiment.

In the MOSFET 200, the first electrode (the first source electrode) 22 on the n-type GaN layer (the third GaN-based semiconductor layer) 18 is formed with the same materials as those of the second electrode (the second source electrode) 24 on the high impurity concentration region 16b of the p-type GaN layer (the second GaN-based semiconductor layer) 16. The first electrode 22 and the second electrode 24 each have a stack structure of Ti (titanium)/Al (aluminum)/Ti (titanium), for example. The first electrode (the first source electrode) 22 and the second electrode (the second source electrode) 24 are formed with the same layer.

According to this embodiment, the first electrode 22 and the second electrode 24 are formed with the same materials, and accordingly, the procedures for manufacturing the MOS- FET 200 can be simplified. Thus, the MOSFET 200 that is easily manufactured at low costs can be realized.

Third Embodiment

A semiconductor device according to this embodiment and a method of manufacturing the semiconductor device are the same as those according to the first embodiment, except that the third GaN-based semiconductor layer is an epitaxially grown layer. Therefore, explanation of the same aspects as those of the first embodiment is not repeated herein.

Figure 8:
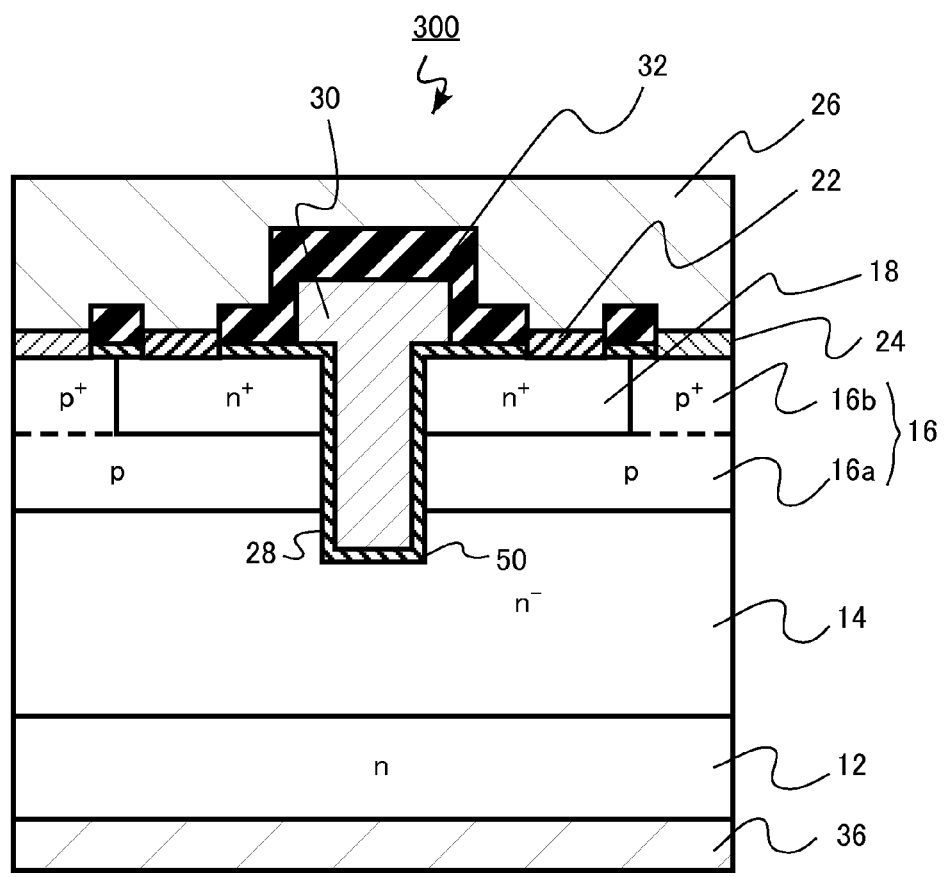
FIG. 8 is a schematic cross-sectional view of a semiconductor device according to a third embodiment.

FIG. 8 is a schematic cross-sectional view of the structure of a MOSFET that is a semiconductor device according to this embodiment. In the MOSFET 300, the n-type GaN layer (the third GaN-based semiconductor layer) 18 is an epitaxially grown layer.

Next, the method of manufacturing the semiconductor device according to this embodiment is described.

By the method of manufacturing the semiconductor device according to this embodiment, a second trench of such a depth that does not reach the first GaN-based semiconductor layer is formed in the second GaN-based semiconductor layer prior to the formation of the first trench, and a GaN-based semiconductor layer is formed in the second trench by an epitaxial growth technique, to form the third GaN-based semiconductor layer.

Figure 9:
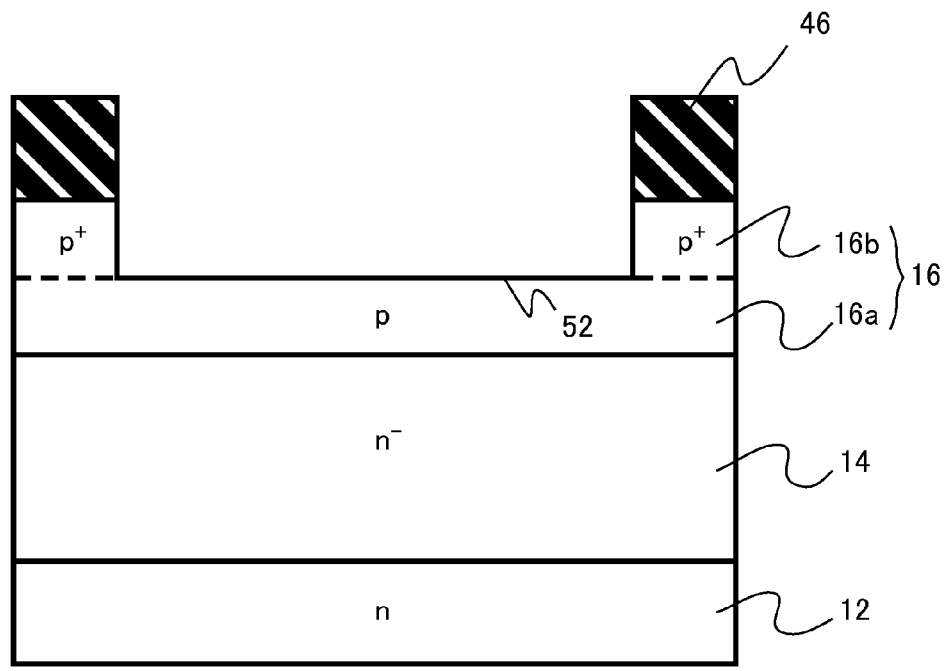
FIG. 9 is a schematic cross-sectional view illustrating a method of manufacturing the semiconductor device according to the third embodiment.
Figure 10:
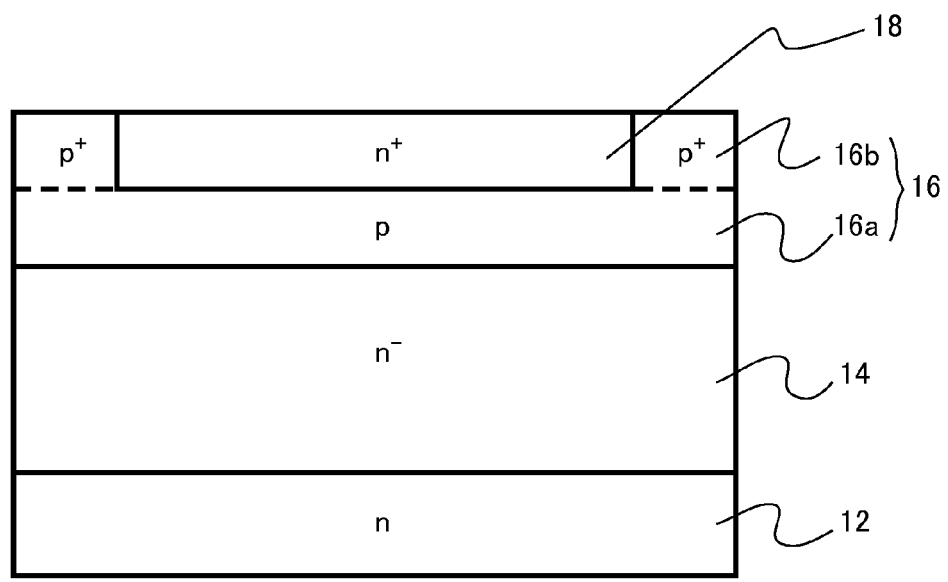
FIG. 10 is a schematic cross-sectional view illustrating the method of manufacturing the semiconductor device according to the third embodiment.

FIGS. 9 and 10 are schematic cross-sectional views illustrating the method of manufacturing the semiconductor device according to this embodiment.

Up to the formation of the p-type GaN layer (the second GaN-based semiconductor layer) 16, the procedures are the same as those according to the first embodiment. Prior to the formation of the first trench 50, the second trench 52 of such a depth that does not reach the n-type GaN layer (the first GaN-based semiconductor layer) 14 is formed in the p-type GaN layer (the second GaN-based semiconductor layer) 16 (FIG. 9).

To form the second trench 52, patterning is performed on a silicon oxide film by photolithography and etching, and a third mask material 46 is formed with the silicon oxide film, for example. With the third mask material 46 serving as a mask, the second trench 52 that extends from the upper surface of the n-type GaN layer 18 and has such a depth that its bottom portion reaches the p-type low impurity concentration region 16a but does not reach the n-type GaN layer 14 is formed. The depth of the second trench 52 is not smaller than 0.5 μm and not greater than 1.0 μm, for example.

After that, the n-type GaN layer (the third GaN-based semiconductor layer) 18 is selectively formed in the second trench 52 by an epitaxial growth technique. The third mask material 46 is then removed (FIG. 10). The procedures thereafter are the same as those according to the first embodiment.

According to this embodiment, the activation rate of the n-type impurity is increased by forming the n-type GaN layer (the third GaN-based semiconductor layer) 18 by an epitaxial growth technique. Accordingly, the contact resistance between the first electrode (the first source electrode) 22 and the n-type GaN layer (the third GaN-based semiconductor layer) 18 is lowered. The diffusion layer resistance of the n-type GaN layer (the third GaN-based semiconductor layer) 18 is also lowered. Accordingly, the on-resistance of the MOSFET 300 is lowered. Thus, the MOSFET 300 with high on-state current can be realized.

Also, crystal defects due to ion implantation can be avoided by forming the n-type GaN layer (the third GaN-based semiconductor layer) 18 by epitaxial growth technique, instead of an ion implantation technique. Accordingly, the MOSFET 300 that has excellent characteristics such as reduced junction leakage current can be realized.

Fourth Embodiment

A semiconductor device according to this embodiment and a method of manufacturing the semiconductor device are the same as those according to the third embodiment, except that the third GaN-based semiconductor layer is an AlGaN layer. Therefore, explanation of the same aspects as those of the third embodiment is not repeated herein.

In the MOSFET according to this embodiment, the third GaN-based semiconductor layer 18 is an n-type AlGaN (aluminum gallium nitride) layer. The n-type AlGaN layer contains Si (silicon) as the n-type impurity, for example.

The MOSFET according to this embodiment can be manufactured by selectively forming the n-type AlGaN layer, instead of the n-type GaN layer of the third embodiment, in the second trench 52 by an epitaxial growth technique.

In the MOSFET according to this embodiment, the interface between the third GaN-based semiconductor layer 18 and the second GaN-based semiconductor layer 16 is a heterojunction of GaN/AlGaN. Therefore, a two-dimensional electron gas (2DEG) is generated in this interface. Accordingly, the electron density and the electron mobility in the source region are increased. Thus, the MOSFET with high on-state current can be realized.

Fifth Embodiment

A semiconductor device according to this embodiment and a method of manufacturing the semiconductor device are the same as those according to the third embodiment, except that the third GaN-based semiconductor layer is a stack structure formed with a GaN layer on the side of the second GaN-based semiconductor layer and an AlGaN layer on the GaN layer. Therefore, explanation of the same aspects as those of the third embodiment is not repeated herein.

Figure 11:
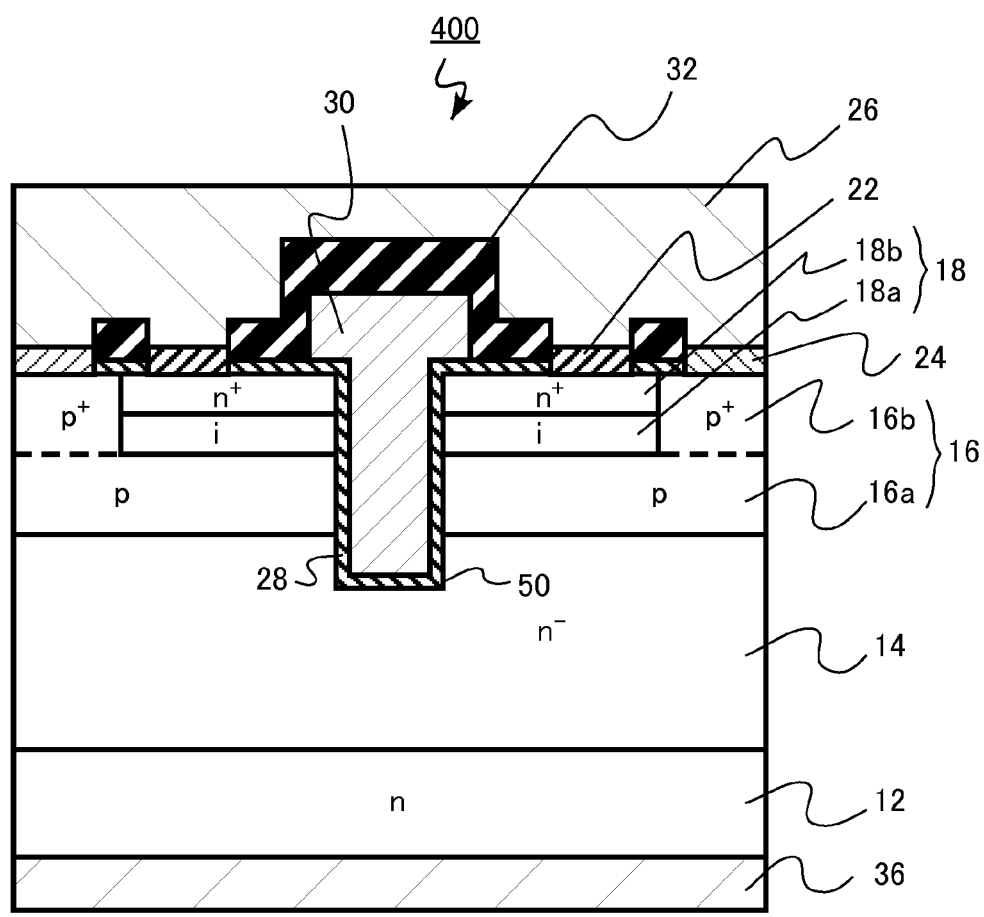
FIG. 11 is a schematic cross-sectional view of a semiconductor device according to a fifth embodiment.

FIG. 11 is a schematic cross-sectional view of the structure of a MOSFET that is a semiconductor device according to this embodiment. In the MOSFET 400, the third GaN-based semiconductor layer 18 is a stack structure formed with an undoped (i-type) GaN layer 18a and an n-type AlGaN (aluminum gallium nitride) layer 18b. The n-type AlGaN layer 18b contains Si (silicon) as the n-type impurity, for example.

Figure 12:
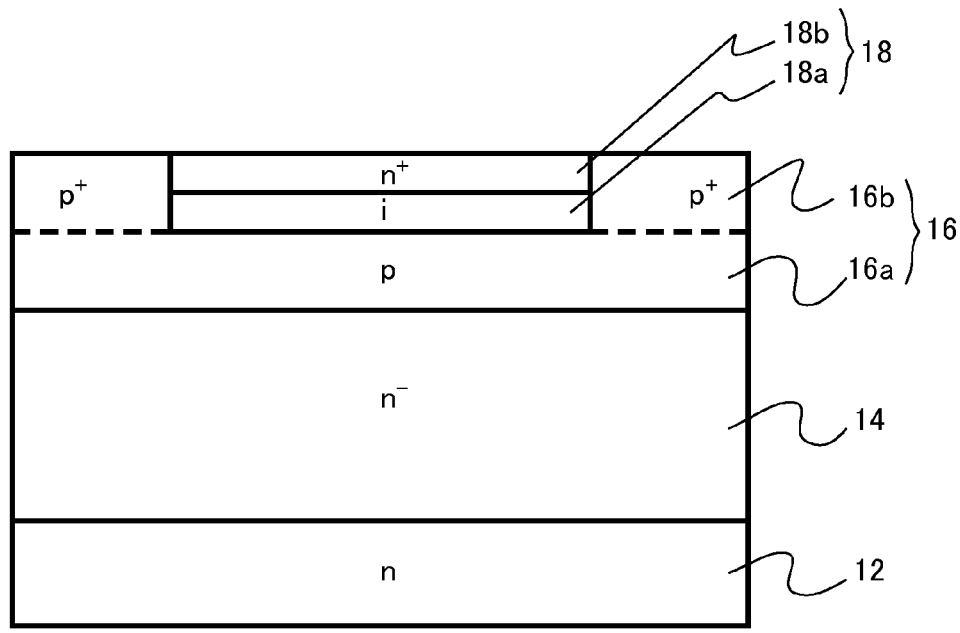
FIG. 12 is a schematic cross-sectional view illustrating a method of manufacturing the semiconductor device according to the fifth embodiment.

FIG. 12 is a schematic cross-sectional view illustrating the method of manufacturing the semiconductor device according to this embodiment. The MOSFET 400 according to this embodiment can be manufactured by selectively and continuously forming the i-type GaN layer 18a and the n-type AlGaN layer 18b, instead of the n-type GaN layer of the third embodiment, in the second trench 52 by an epitaxial growth technique.

In the MOSFET 400 according to this embodiment, the interface between the undoped (i-type) GaN layer 18a and the n-type AlGaN (aluminum gallium nitride) layer 18b is a heterojunction of GaN/AlGaN. Therefore, a two-dimensional electron gas (2DEG) is generated in this interface. Accordingly, the electron density and the electron mobility in the source region are increased. Thus, the MOSFET 400 with high on-state current can be realized.

Alternatively, GaN layers and AlGaN layers may be alternately stacked to form two or more GaN/AlGaN heterojunctions. In this case, a two-dimensional electron gas (2DEG) is generated in two or more interfaces. Accordingly, a MOSFET 400 with even higher on-state current can be realized.

Sixth Embodiment

A method of manufacturing a semiconductor device according to this embodiment is the same as that according to the first embodiment, except that a MOSFET is formed on a Si (silicon) substrate. Therefore, explanation of the same aspects as those of the first embodiment is not repeated herein.

Figure 13:
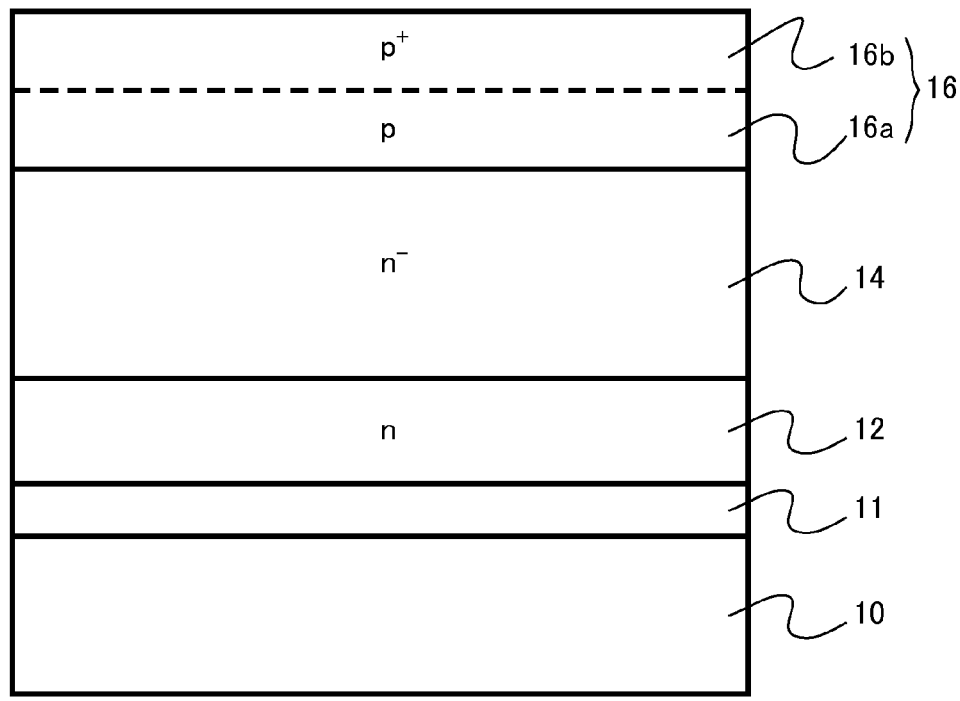
FIG. 13 is a schematic cross-sectional view illustrating a method of manufacturing a semiconductor device according to a sixth embodiment.
Figure 14:
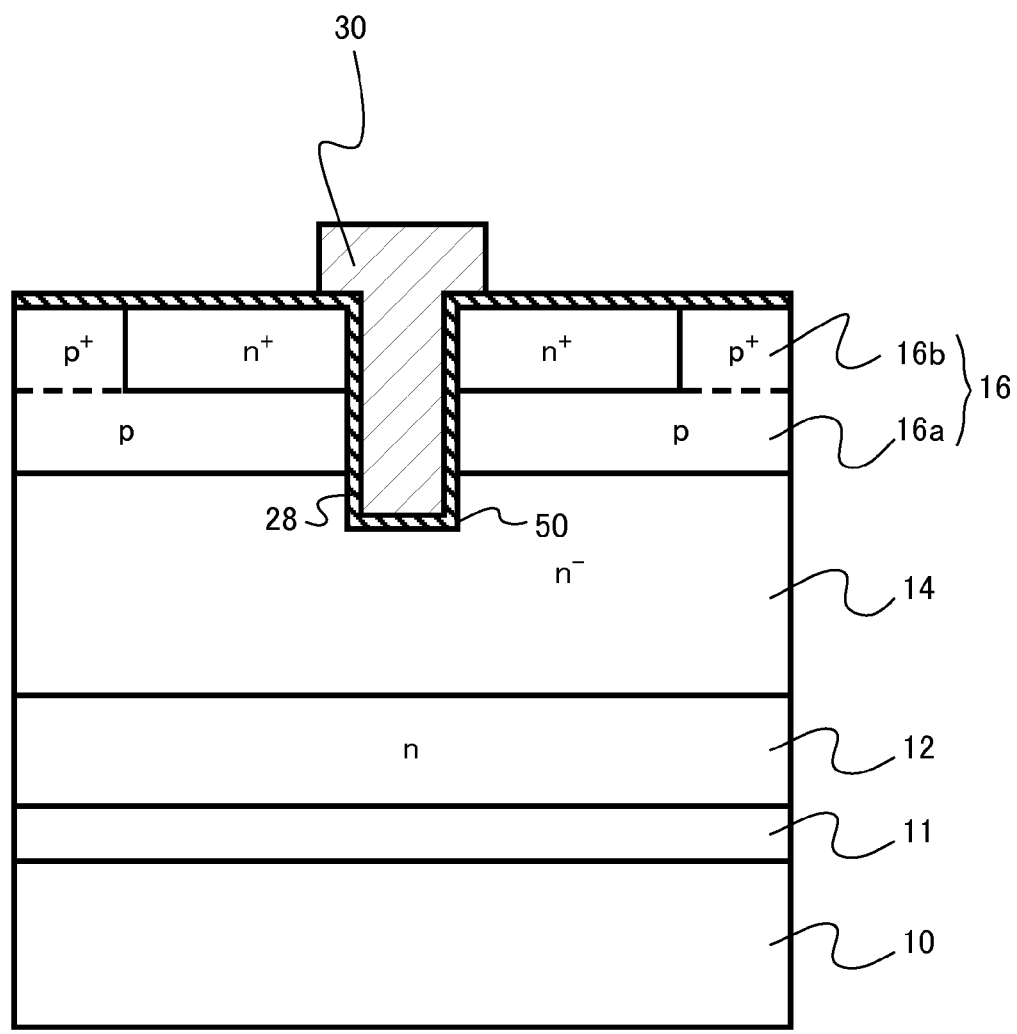
FIG. 14 is a schematic cross-sectional view illustrating the method of manufacturing the semiconductor device according to the sixth embodiment.

FIGS. 13 and 14 are schematic cross-sectional views illustrating the method of manufacturing a semiconductor device according to this embodiment.

First, a Si (silicon) substrate 10 is prepared. The surface of the Si (silicon) substrate 10 is a (111) plane, for example. The surface may be offset from the (111) plane.

A buffer layer 11 is then formed on the Si (silicon) substrate 10 by an epitaxial growth technique. The buffer layer 11 is an AlN (aluminum nitride) layer, for example. The buffer layer 11 is formed by MOCVD, for example.

The n-type GaN substrate (the GaN-based semiconductor) 12 is then formed on the buffer layer 11 by an epitaxial growth technique. The n-type GaN layer (the first GaN-based semiconductor layer) 14 and the p-type GaN layer (the second GaN-based semiconductor layer) 16 are formed on the n-type GaN substrate 12 (FIG. 13).

The gate electrode 30 is then formed by the same manufacturing method as that according to the first embodiment (FIG. 14). After that, the same manufacturing procedures as those according to the first embodiment are carried out until the formation of the third electrode (the drain electrode) 36.

Prior to the formation of the third electrode (the drain electrode) 36, the Si (silicon) substrate 10 and the buffer layer 11 are removed by CMP (Chemical Mechanical Polishing), for example.

The third electrode (the drain electrode) 36 is then formed under the exposed lower surface of the n-type GaN substrate 12.

By the method of manufacturing the semiconductor device according to this embodiment, a MOSFET that performs stable operations can be realized as in the first embodiment.

Although MOSFETs have been described in the above embodiments, the embodiments can also be applied to devices other than MOSFETs, such as vertical IGBTs.

While certain embodiments have been described, these embodiments have been presented by way of example only, and are not intended to limit the scope of the inventions. Indeed, the semiconductor devices and the methods of manufacturing the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an n-type first GaN-based semiconductor layer;
   a p-type second GaN-based semiconductor layer provided above the first GaN-based semiconductor layer, the p-type second GaN-based semiconductor layer including a low impurity concentration region and a high impurity concentration region, the low impurity concentration region provided between the high impurity concentration region and the first GaN-based semiconductor layer;
   an n-type third GaN-based semiconductor layer provided above the low impurity concentration region;
   a gate electrode having one end thereof located at the third GaN-based semiconductor layer or in a higher position than the third GaN-based semiconductor layer and the other end thereof located in the first GaN-based semiconductor layer, the gate electrode being located adjacent to the third GaN-based semiconductor layer, the low impurity concentration region, and the first GaN-based semiconductor layer intervening a gate insulating film;
   a first electrode provided above the third GaN-based semiconductor layer;
   a second electrode provided above the high impurity concentration region, the second electrode being a different material from the first electrode; and
   a third electrode provided below the first GaN-based semiconductor layer.

2. The semiconductor device according to claim 1, wherein the second GaN-based semiconductor layer is an epitaxially grown layer.

3. The semiconductor device according to claim 1, wherein the third GaN-based semiconductor layer contains a p-type impurity.

4. The semiconductor device according to claim 1, wherein the third GaN-based semiconductor layer includes an AlGaN layer.

5. The semiconductor device according to claim 4, wherein the third GaN-based semiconductor layer is a stack structure provided with a GaN layer on a side of the second GaN-based semiconductor layer and the AlGaN layer on the GaN layer.

6. The semiconductor device according to claim 1, wherein the third GaN-based semiconductor layer is an epitaxially grown layer.

7. A semiconductor device comprising:
   an n-type first GaN-based semiconductor layer;
   a p-type second GaN-based semiconductor layer provided above the first GaN-based semiconductor layer, the p-type second GaN-based semiconductor layer including a low impurity concentration region and a high impurity concentration region, the low impurity concentration region provided between the high impurity concentration region and the first GaN-based semiconductor layer;
   an n-type third GaN-based semiconductor layer provided above the low impurity concentration region;
   a trench having one end thereof located in the third GaN-based semiconductor layer and the other end thereof located in the first GaN-based semiconductor layer;
   a gate insulating film provided on an inner wall of the trench, the inner wall being provided with the third GaN-based semiconductor layer, the low impurity concentration region, and the first GaN-based semiconductor layer;
   a gate electrode provided above the gate insulating film;
   a first electrode provided above the third GaN-based semiconductor layer;
   a second electrode provided above the high impurity concentration region, the second electrode being a different material from the first electrode; and
   a third electrode provided below the first GaN-based semiconductor layer.

8. The semiconductor device according to claim 7, wherein the second GaN-based semiconductor layer is an epitaxially grown layer.

9. The semiconductor device according to claim 7, wherein the third GaN-based semiconductor layer contains a p-type impurity.

10. The semiconductor device according to claim 7, wherein the third GaN-based semiconductor layer includes an AlGaN layer.

11. The semiconductor device according to claim 10, wherein the third GaN-based semiconductor layer is a stack structure provided with a GaN layer on a side of the second GaN-based semiconductor layer and the AlGaN layer on the GaN layer.

* * * * *